(12) United States Patent
Matsuo

(10) Patent No.: US 6,590,232 B2
(45) Date of Patent: Jul. 8, 2003

(54) OPTICAL COUPLING SEMICONDUCTOR APPARATUS AND METHOD FOR MANUFACTURING THE SAME

(75) Inventor: Yoshihiko Matsuo, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/939,766

(22) Filed: Aug. 28, 2001

(65) Prior Publication Data

US 2002/0025593 A1 Feb. 28, 2002

(30) Foreign Application Priority Data

Aug. 28, 2000 (JP) ........................................ 2000-257115

(51) Int. Cl.[7] .......................... H01L 27/15; H01L 31/12; H01L 33/00
(52) U.S. Cl. .......................................... 257/82; 250/551
(58) Field of Search .................. 250/227.24; 257/79–82

(56) References Cited

U.S. PATENT DOCUMENTS 4,322,628 A * 3/1982 Tanaka ........................ 250/551
4,450,461 A    5/1984 Cook et al.

FOREIGN PATENT DOCUMENTS

| JP | A62291077 | 12/1987 |
| JP | A9199756 | 7/1997 |
| JP | A1117212 | 1/1999 |

* cited by examiner

*Primary Examiner*—Kamand Cuneo
*Assistant Examiner*—Asok Kumar Sarkar
(74) *Attorney, Agent, or Firm*—Birch, Stewart, Kolasch & Birch, LLP

(57) ABSTRACT

An object of the invention is to raise and stabilize the efficiency of light transmission between a light-emitting device and a light-receiving device. A light-transmissive resin projection has a constant height over the extent from the light-emitting device to the light-receiving device and is shaped triangular in section. Since an outer package is white-colored, the interface between the light-transmissive resin projection and the outer package is also white-colored and, hence, the light reflectivity of the interface is high. Accordingly, light emitted from the light-emitting device is reflected at faces of the light-transmissive resin projection, gathered to the vertex portion, guided to the light-receiving device, and received by the light-receiving device. At this time, light is transmitted from the light-emitting device to the light-receiving device without being dispersed within the light-transmissive resin projection. Further, since the light transmission distance is short, the light transmission efficiency is high and is stabilized.

10 Claims, 7 Drawing Sheets

OPTICAL COUPLING SEMICONDUCTOR APPARATUS AND METHOD FOR MANUFACTURING THE SAME

BACKGROUND OF THE INVENTION

1. Field of the Invention

The present invention relates to an optical coupling semiconductor apparatus having a light-emitting device and a light-receiving device which are sealed by plastic molding, and to a method for manufacturing the same.

2. Description of the Related Art

Among prior art semiconductor apparatus of this type, there is known a semiconductor apparatus with a double-layer molding seal as shown in FIG. 12, for example. As shown in FIG. 12, light-emitting device 103 and light-receiving device 104 are mounted on headers 101a and 102a, respectively, of previously bent lead frames 101 and 102 of a metal material, such as Cu alloy or Fe alloy, by connecting them to respective headers with an electrically conductive paste, such as Ag paste, (called "die bonding"). These devices 103 and 104 are connected to the corresponding lead frames by means of wires (called "wire bonding").

The light-emitting device 103 is coated with a silicone resin (called "precoat") to relieve stress, and the light-emitting device 103 and light-receiving device 104 are positioned to face each other by spot welding of the lead frames 101 and 102 or using a loading frame set. Further, an inner package 105 serving as an optical path between the light-emitting device 103 and the light-receiving device 104 is formed by primary transfer molding using a light-transmissive epoxy resin, followed by removal of resin burr resulting from leakage of excess resin.

Subsequently, an outer package 106 is formed by secondary transfer molding using a lightproof epoxy resin to prevent penetration of external disturbing light and leakage of internal light to the outside. Then, the lead frames 101 and 102 are plated for lead finishing. Further, an auxiliary lead portion, which plays two roles, i.e., tying and supporting of the lead frames 101 and 102 and prevention of resin leakage during transfer molding, is cut away (called "tie bar cutting"), and exposed lead portions of the lead frames extending from the outer package 106 are formed into external terminals (called "forming").

In such a prior art apparatus, light emitted from the light-emitting device 103 advances straight to the light-receiving device 104.

A reflection-type photocoupler disclosed in, for example, Japanese Unexamined Patent Publication JP-A 11-17212 (1999) is constructed as shown in FIG. 13. Specifically, this photocoupler is constructed by: mounting light-emitting device 203 and light-receiving device 204 on lead frames 201 and 202, respectively; covering the light-emitting device 203 and light-receiving device 204 with a silicone resin 205 to define an optical path between the light-emitting device 203 and the light-receiving device 204 (called "docking"); forming an outer package 206 by transfer molding using a lightproof epoxy resin; and performing finish-plating of the lead frames 201 and 202, tie bar cutting, forming and the like.

In such a prior art photocoupler, as shown in FIG. 14, light emitted from the light-emitting device 203 is reflected by the interface defined between the silicone resin 205 and the outer package 206 and then reaches the light-receiving device 204.

With respect to the prior art apparatus shown in FIG. 12, however, the headers 101a and 102a necessarily face each other because the light-emitting device 103 and the light-receiving device 104 are disposed facing each other. When the headers 101a and 102a in this state are sealed with the epoxy resin that will serve as the inner package 105, a floating capacity (electrostatic capacity) results between the headers 101a and 102a. In this case, when the potential between the light-emitting device 103 and the light-receiving device 104 varies steeply, displacement current flows through the light-receiving device 104 and, hence, the output of the light-receiving device 104 is apparently changed, which causes a malfunction to occur.

With respect to the prior art photocoupler shown in FIG. 13, on the other hand, the light-emitting device 203 and the light-receiving device 204 do not face each other and, hence, the lead frames 201 and 202 do not face each other either. Accordingly, a very low floating capacity results. However, since light emitted from the light-emitting device 203 is dispersed within the silicone resin 205 and repeatedly reflected by the interface between the silicone resin 205 and the outer package 206, the proportion of light absorbed by the interface or the like before light reaches the light-receiving device 204 is high, which raises a problem that a decrease or fluctuations in the efficiency of light transmission from the light-emitting device 203 to the light-receiving device 204 occur. In addition, since the silicone resin 205 is large in volume, possible thermal expansion thereof is likely to cause the outer package 206 to crack, thus resulting in an inconvenience such as penetration or leakage of light.

SUMMARY OF THE INVENTION

The invention has been made in view of the foregoing problems involved in the prior art, and accordingly, it is an object of the invention to provide an optical coupling semiconductor apparatus which is capable of raising and stabilizing the efficiency of light transmission from the light-emitting device to the light-receiving device and to provide a method for manufacturing the same.

According to the invention, there is provided an optical coupling semiconductor apparatus comprising:
- a light-emitting device;
- a light-receiving device;
- lead frames carrying the light-emitting device and the light-receiving device, respectively, at locations spaced apart from each other; and
- a light-transmissive resin projection having a longitudinally extending tapered vertex portion, the projection functioning as an optical path extending between the light-emitting device and the light-receiving device, having a nearly constant height, reflecting light emitted from the light-emitting device to gather the light to the vertex portion, and guiding the light thus gathered to the light-receiving device.

According to the invention, the light-transimissive resin projection having a constant height functions as an optical path extending between the light-emitting device and the light-receiving device, reflects light emitted from the light-emitting device to gather the light to the vertex portion thereof, and guides the light to the light-receiving device. Accordingly, light from the light-emitting device is guided to the light-receiving device without being dispersed. For this reason, the efficiency of light transmission from the light-emitting device to the light-receiving device is high and is stabilized.

In the invention, it is preferable that the light-emitting device and the light-receiving device have a light-emitting face and a light-receiving face, respectively, which are located on substantially the same reference plane.

According to the invention, it is possible to ensure a higher light transmission efficiency and minimize the floating capacity between the lead frames carrying the light-emitting device and the light-receiving device, respectively.

In the invention, it is preferable that the light-transmissive resin projection has a sectional configuration with the vertex portion and two sides defining the vertex portion.

According to the invention, the light-transmissive resin projection of such a sectional configuration is capable of reflecting light emitted from the light-emitting device at two inner wall surfaces facing each other to gather the light to the vertex portion, and guiding the light thus gathered.

In the invention, it is preferable that the light-transmissive resin projection is formed of an epoxy resin which is capable of setting through cationic polymerization.

According to the invention, this epoxy resin is preferred in terms of humidity resistance.

Further, in the invention, it is preferable that the light-transmissive resin projection is dome-shaped at a location in a vicinity of the light-receiving device to converge light at the light-receiving device.

According to the invention, the efficiency of light transmission to the light-receiving device is further raised.

In the invention, it is preferable that a distance l between the light-emitting device and the light-receiving device and a height L of the light-transmissive resin projection are set to satisfy the following relation:

$$l \geq L.$$

According to the invention, the distance l between the light-emitting device and the light-receiving device and the height L of the light-transmissive resin projection are set to satisfy the relation: $l \geq L$, for light to be gathered without being dispersed.

Further, in the invention, it is preferable that the light-transmissive resin projection has a width larger than a width of a light-emitting area of the light-emitting device and a width of a light-receiving area of the light-receiving device.

According to the invention, the light-transmissive resin projection is capable of efficiently receiving light from the light-emitting device and guiding it to the light-receiving device, thereby ensuring higher light transmission efficiency.

In the invention, it is preferable that the light-transmissive resin projection has opposite ends located as superposed on the light-emitting device and the light-receiving device, respectively.

Alternatively, in the invention, it is preferable that the light-transmissive resin projection has one end adjoining the light-receiving device.

According to the invention, the light-transmissive resin projection has an end superposed on or adjoining the light-emitting device or the light-receiving device and, hence, light from the light-emitting device is guided to the light-receiving device before it is dispersed, whereby higher light transmission efficiency is ensured.

In the invention, it is preferable that the light-emitting device is shaped into a prism having at least two side walls oriented toward the light-receiving device.

According to the invention, if the light-emitting device is in the form of a quadratic prism, the amount of light received by the light-receiving device from the light-emitting device having two side walls oriented toward the light-receiving device increases by $\sqrt{2}$ times at maximum as compared with the case where the light-emitting device has only one side wall oriented toward the light-receiving device.

According to the invention, there is also provided a method for manufacturing an optical coupling semiconductor apparatus, comprising the steps of: mounting a light-emitting device and a light-receiving device on respective lead frames and connecting the light-emitting device and the light-receiving device to the corresponding lead frames by die bonding or wire bonding; forming a light-transmissive resin projection having a longitudinally extending tapered vertex portion and a substantially constant height, the resin projection functioning as an optical path between the light-emitting device and the light-receiving device; and sealing the light-emitting device, the light-receiving device and the light-transmissive resin projection with a lightproof resin.

In the invention, it is preferable that the lightproof resin contains a flame-retardant resin which is white-colored and has an increased light reflectivity at least at a location in a vicinity of an interface with the light-transmissive resin projection.

According to the invention, such a lightproof resin raises the light reflectivity at the interface with the light-transmissive resin projection while ensuring higher light transmission efficiency.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
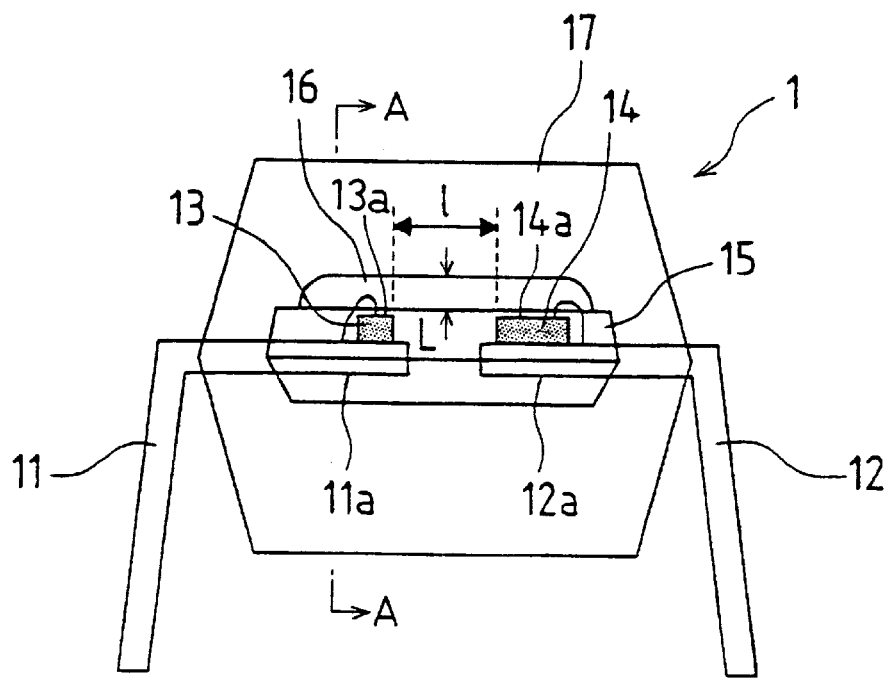
FIG. 1 is a sectional view showing an optical coupling semiconductor apparatus as a first embodiment of the invention.

Now referring to the drawings, preferred embodiments of the invention are described below.

Figure 2:
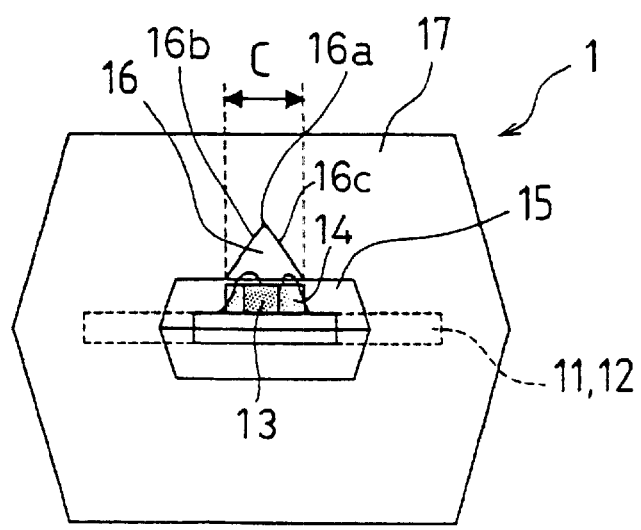
FIG. 2 is a sectional view as viewed from cutting line A—A in FIG. 1.

FIG. 1 is a sectional view showing an optical coupling semiconductor apparatus as a first embodiment of the invention and FIG. 2 is a sectional view as viewed from cutting line A—A in FIG. 1.

In the optical coupling semiconductor apparatus 1 according to this embodiment, light-emitting device 13 and light-receiving device 14 are mounted on headers 11a and 12a, respectively, of lead frames 11 and 12 by connecting them to respective headers with an electrically conductive paste, such as Ag paste, (called "die bonding"), and these devices 13 and 14 are connected to the corresponding lead frames by means of Au wires (called "wire bonding").

Subsequently, the lead frames 11 and 12 are set in a mold for forming an inner package by being positioned with a high precision, and then a light-transmissive resin is injected into the mold to form the inner package 15 sealing the light-emitting device 13, light-receiving device 14 and the headers 11a and 12a. The inner package 15 contains a light-transmissive resin projection 16. This light-transmissive resin projection 16 functions as an optical path extending from the light-emitting device 13 to the light-receiving device 14 and has a triangular sectional configuration when cut perpendicularly to the axis thereof. Specifically, the light-transmissive resin projection 16 is formed to have a longitudinally extending tapered a vertex portion 16a. Further, the light-transmissive resin projection 16 has a width c that is larger than the width of a light-emitting area (light-emitting face) 13a of the light-emitting device 13 and the width of a light-receiving area (light-receiving face) 14a of the light-receiving device 14. The angle of the vertex portion 16a is selected to be within a range of from 60° to 120° in consideration of easiness of mold release of the light-transmissive resin projection 16.

The inner package 15 can be molded by, for example, a molding method using an injection mold such as LIM (Liquid Injection Molding) and an "ELM-3001" (trade name) series one-pack type epoxy resin available from NIPPON PELNOX CORPORATION. The "ELM-3001" series epoxy resins are characterized that they set through cationic polymerization and have superior humidity resistance. Resin burr resulting from excess resin leaked out of the mold is removed using a deburring mold, a blaster or the like.

Further, an outer package 17 is formed using a white-colored lightproof epoxy resin containing titanium oxide to prevent penetration of external disturbing light and leakage of light from the light-transmissive resin projection 16 serving as the optical path. This white-colored lightproof epoxy resin is flame retardant.

Subsequently, the lead frames 11 and 12 are plated for lead finishing. Thereafter, an auxiliary lead portion, which plays two roles, i.e., tying and supporting of the lead frames 11 and 12 and prevention of resin leakage during transfer molding, is cut away (called "tie bar cutting"), and exposed lead portions of the lead frames extending from the outer package 17 are formed into external terminals (called "forming").

The optical coupling semiconductor apparatus 1 is manufactured by the method thus described.

In the optical coupling semiconductor apparatus 1 thus constructed, the light-transmissive resin projection 16 has a constant height over the extent from the light-emitting device 13 to the light-receiving device 14 and is shaped triangular in section. Since the outer package 17 is white-colored, the interface between the light-transmissive resin projection 16 and the outer package 17 is also white-colored and, hence, the light reflectivity of the interface is high. Accordingly, light emitted from the light-emitting device 13 is reflected at faces 16b and 16c of the light-transmissive resin projection 16, gathered to the vertex portion 16a, guided to the light-receiving device 14, and received by the light-receiving device 14. At this time, light is transmitted from the light-emitting device 13 to the light-receiving device 14 without being dispersed within the light-transmissive resin projection 16. Further, since the light transmission distance is short, the light transmission efficiency is high and is stabilized.

In addition, since the width of the light-transmissive resin projection 16 is made larger than the width of the light-emitting area 13a of the light-emitting device 13 and the width of the light-receiving area 14a of the light-receiving device 14, the light-transmissive resin projection 16 is capable of efficiently receiving light from the light-emitting device 14 and guiding it to the light-receiving device 14, thereby ensuring a higher light transmission efficiency.

In the optical coupling semiconductor apparatus 1, the distance 1 between the light-emitting device 13 and the light-receiving device 14 and the height L of the light-transmissive resin projection are set to satisfy the relation: l≧L. This feature allows light to be effectively gathered without dispersing light.

Further, the feature that the light-emitting device 13 and the light-receiving device 14 are located on substantially the same plane ensures a higher light transmission efficiency. Furthermore, since the headers 11a and 12a are also located on substantially the same plane and do not face each other, a floating capacity generated between the headers 11a and 12a is very small. It is, therefore, unlikely that the output of the light-receiving device 14 is accidentally changed to cause a malfunction by such a floating capacity.

Moreover, there is no need to enlarge the inner package 15 because light transmits through the light-transmissive resin projection 16. It is, therefore, not possible that the outer package 17 becomes cracked due to thermal expansion of the inner package 15.

While the subject embodiment uses an "ELM-3001" series resin for the light-transmissive resin projection 16, an acid anhydride type epoxy resin may be used instead. It should be noted that such an acid anhydride type epoxy resin is inferior in humidity resistance.

"KE-955" (trade name) series epoxy resins available from TOSHIBA CHEMICAL CORP. contain a titanium oxide filler and are colored very close to white. These resin are, therefore, most desirable in raising the light reflectivity at the interface between the light-transmissive resin projection 16 and the outer package 17.

Figure 3:
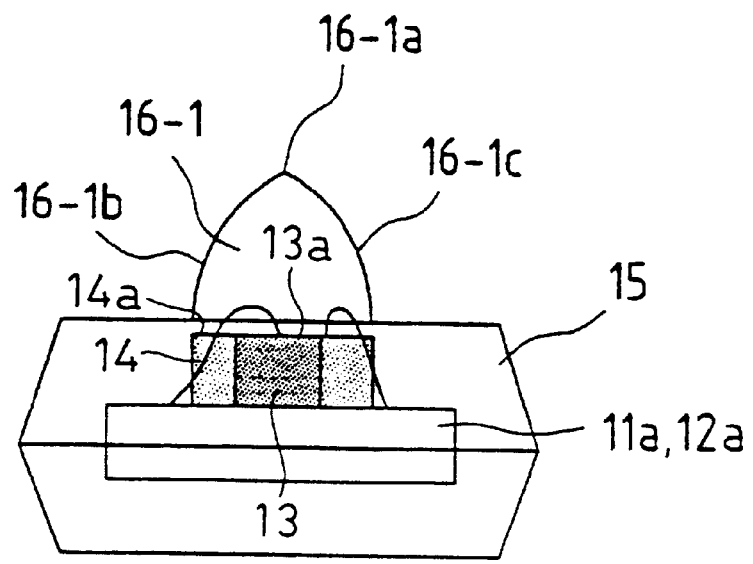
FIG. 3 is a sectional view showing a variation of a light-transmissive resin projection in the optical coupling semiconductor apparatus as the first embodiment.
Figure 4:
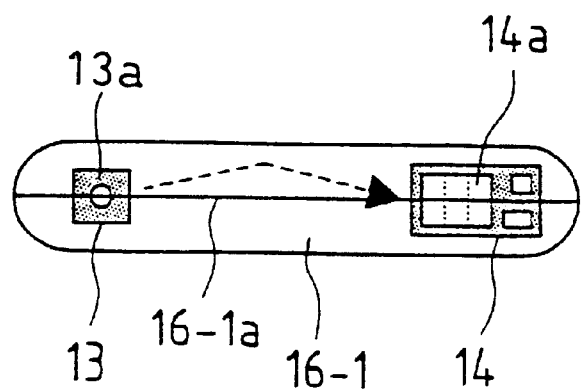
FIG. 4 is a plan view showing the light-transmissive resin projection shown in FIG. 3.

FIG. 3 is a sectional view showing a variation of the light-transmissive projection, and FIG. 4 is a plan view showing this variation of the light-transmissive resin projection. In FIGS. 3 and 4, like reference characters designate parts functioning likewise as the corresponding parts of the apparatus shown in FIGS. 1 and 2.

As shown in FIGS. 3 and 4, light-transmissive resin projection 16-1 has a sectional configuration comprising a vertex portion 16-1a and two curved surfaces 16-1b and 16-1c drawing arcs. The light-transmissive resin projection 16-1 having such a sectional configuration has an advantage that it can be easily removed from the mold.

Figure 5:
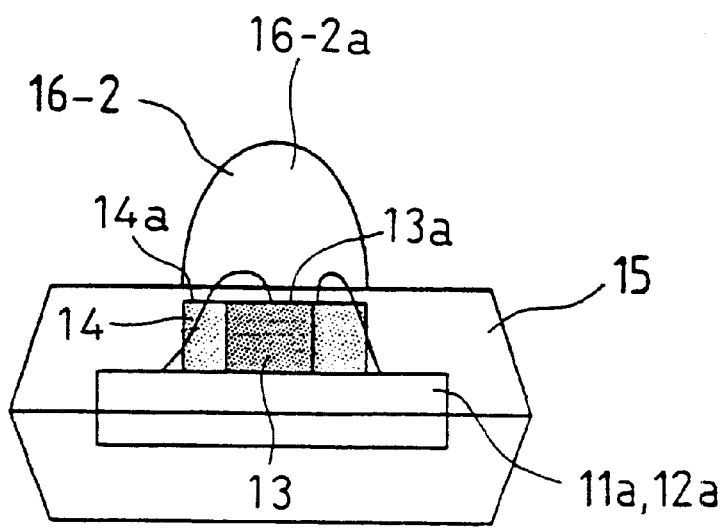
FIG. 5 is a sectional view showing another variation of the light-transimissive resin projection in the optical coupling semiconductor apparatus as the first embodiment.
Figure 6:
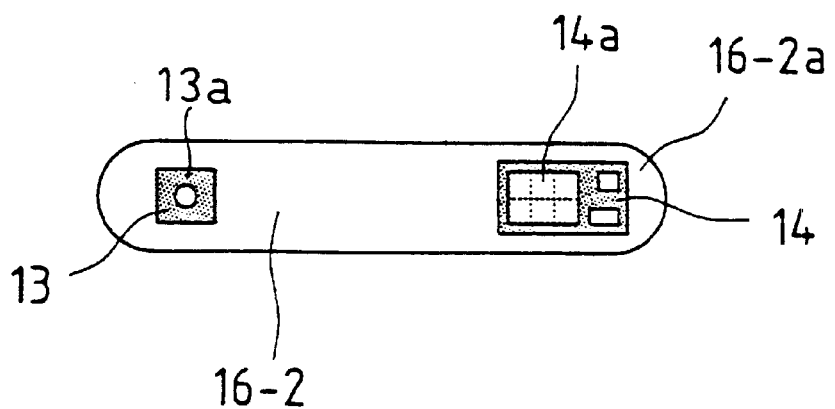
FIG. 6 is a plan view showing the light-transmissive resin projection shown in FIG. 5.

FIG. 5 is a sectional view showing another variation of the light-transmissive projection, and FIG. 6 is a plan view showing this variation of the light-transmissive resin projection. In FIGS. 5 and 6, like reference characters designate parts functioning likewise as the corresponding parts of the apparatus shown in FIGS. 1 and 2.

Light-transmissive resin projection 16-2 shown in FIGS. 5 and 6 has a semielliptic sectional configuration and also has an advantage that it can be easily removed from the mold. The light-transmissive resin projection 16-2 has an end portion 16-2a shaped into a dome above the light-receiving area 14a of the light-receiving device 14. With this feature, light reflected by the inner wall surface of the end portion 16-2a is allowed to converge at the light-receiving area 14a of the light-receiving device 14. As a result, the efficiency of light transmission from the light-emitting device 13 to the light-receiving device 14 is further raised.

It is needless to say that these light-transmissive resin projections 16-1 and 16-2 are each capable of reflecting light to gather it to the vertex portion 16-1a or 16-2a.

Figure 7:
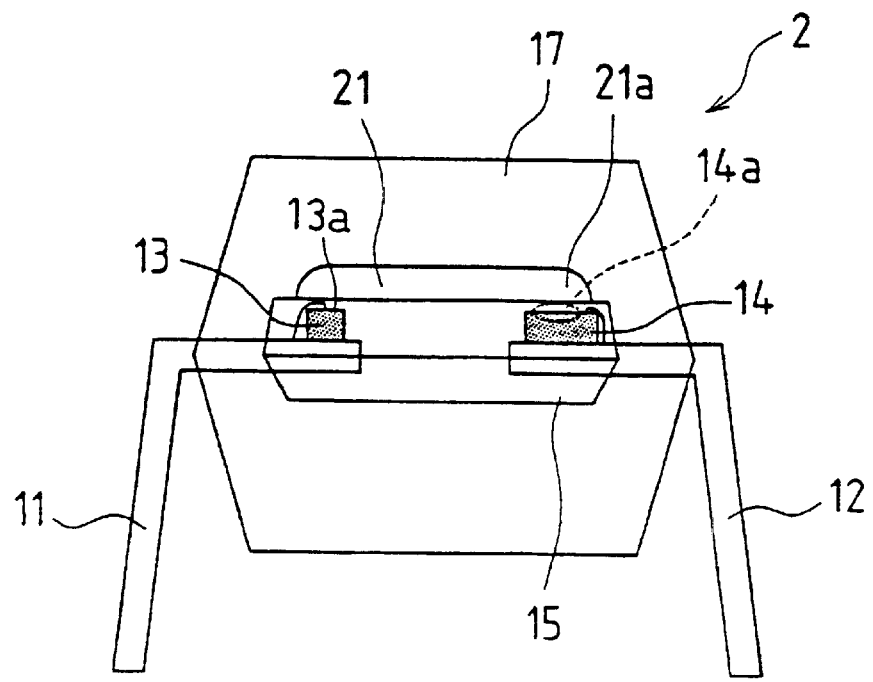
FIG. 7 is a sectional view showing an optical coupling semiconductor apparatus as a second embodiment of the invention.
Figure 8:
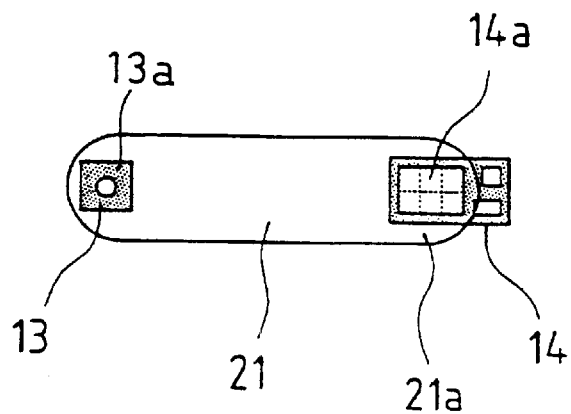
FIG. 8 is a plan view showing a light-transmissive resin projection in the optical coupling semiconductor apparatus shown in FIG. 7.

FIG. 7 is a sectional view showing an optical coupling semiconductor apparatus as a second embodiment of the invention, and FIG. 8 is a plan view showing a light-transmissive resin projection of the optical coupling semiconductor apparatus according to this embodiment. In FIGS. 7 and 8, like reference characters designate parts functioning likewise as the corresponding parts of the apparatus shown in FIGS. 1 and 2.

In the optical coupling semiconductor apparatus 2 according to the subject embodiment, light-transmissive resin projection 21 has one end 21a substantially superposed on an edge of the light-receiving area 14a of the light-receiving device 14. This feature allows light to be guided to the light-receiving device 14 before it is dispersed and absorbed, thereby ensuring a higher light transmission efficiency and an increased amount of light received by the light-receiving device 14. Such a phenomenon was found from experiments.

Like the light-transmissive resin projection 16, the light-transmissive resin projection 21 is formed as part of the inner package 15 formed of a transparent epoxy resin and has a sectional configuration identical with or similar to any one of the light-transmissive resin projections shown in FIGS. 2, 3 and 5.

Figure 9:
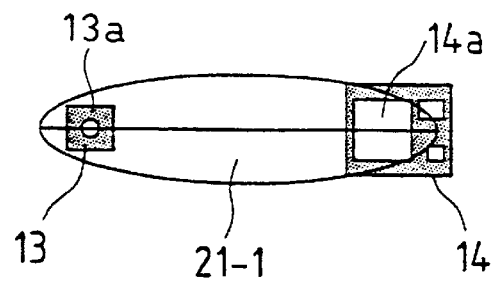
FIG. 9 is a sectional view showing a variation of the light-transmissive resin projection in the optical coupling semiconductor apparatus as the second embodiment.

It should be noted that a substantially spindle-shaped light-transmissive resin projection 21-1 as shown in FIG. 9 may be used in lieu of the light-transmissive resin projection 21 having a constant width.

Figure 10:
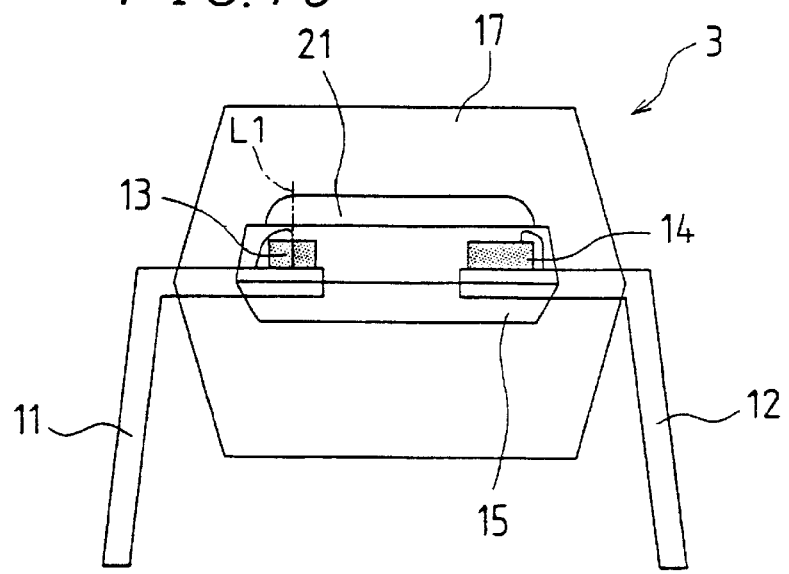
FIG. 10 is a sectional view showing an optical coupling semiconductor apparatus as a third embodiment of the invention.
Figure 11:
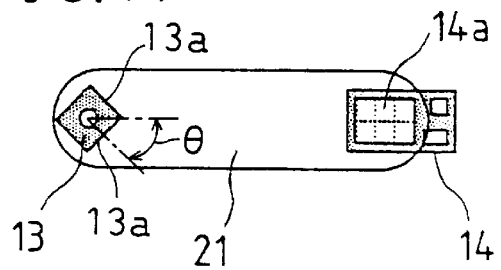
FIG. 11 is a plan view showing a light-transmissive resin projection in the optical coupling semiconductor apparatus shown in FIG. 10.
Figure 12:
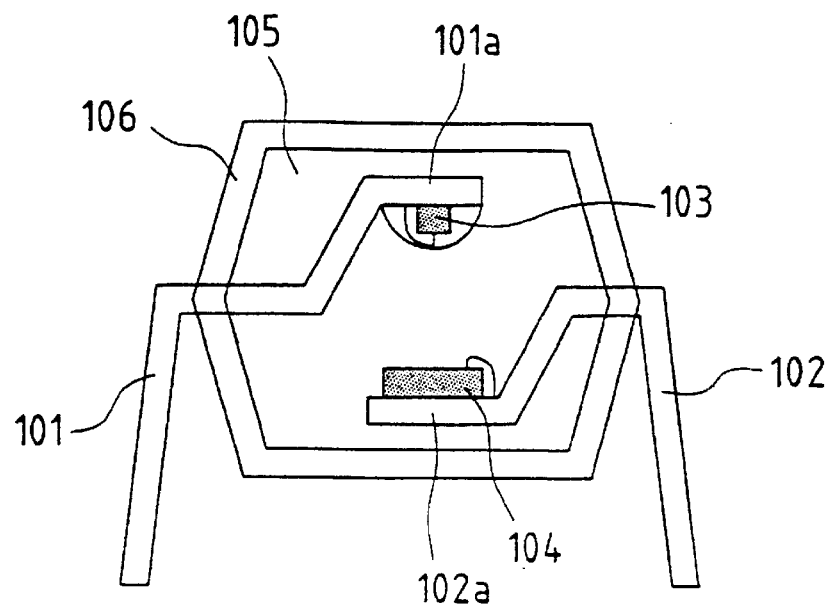
FIG. 12 is a sectional view illustrating a prior art apparatus.
Figure 13:
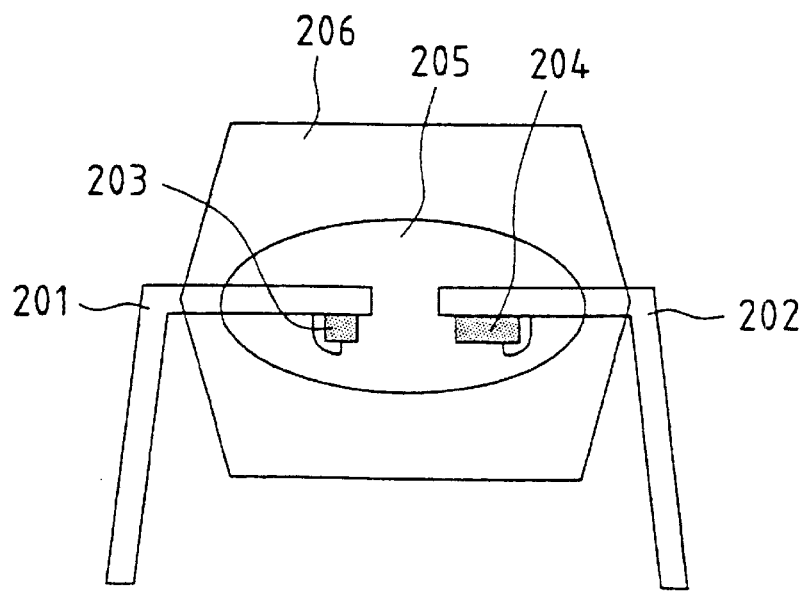
FIG. 13 is a sectional view illustrating a prior art photocoupler.
Figure 14:
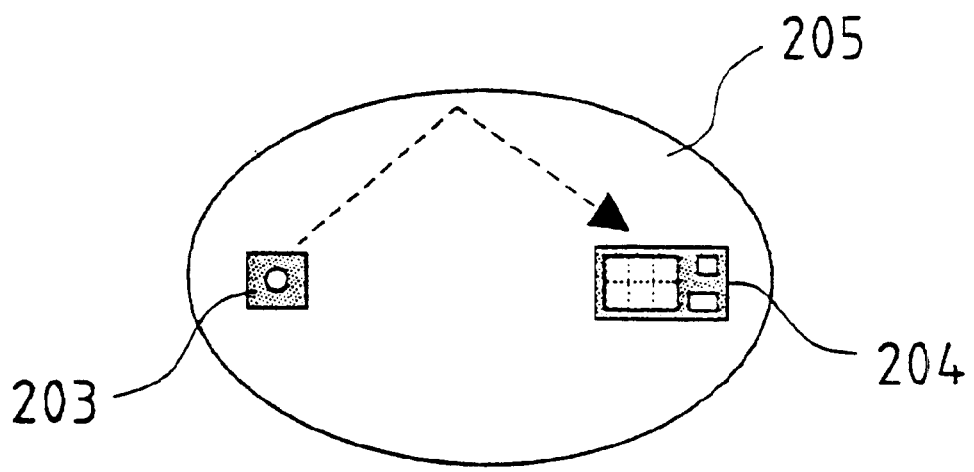
FIG. 14 is a plan view showing a silicone resin in the photocoupler shown in FIG. 13.

FIG. 10 is a sectional view showing an optical coupling semiconductor apparatus as a third embodiment of the invention, and FIG. 11 is a plan view showing a light-transmissive resin projection of the optical coupling semiconductor apparatus according to this embodiment. In FIGS. 10 and 11, like reference characters designate parts functioning likewise as the corresponding parts of the apparatus shown in FIGS. 7 and 8.

In the optical coupling semiconductor apparatus 3 according to the subject embodiment, the light-emitting device 13 is shaped into a quadratic prism and constructed to emit light from four side walls. By rotating the light-emitting device 13 about its central axis L1 extending parallel to the side walls thereof, two side walls of the light-emitting device 13 are oriented toward the light-receiving device 14. The angle θ of rotation of the light-emitting device 13 with respect to a reference state (θ=0°) shown in FIGS. 1 and 2 where only one side wall of the light-emitting device 13 is oriented toward the light-receiving device 14 is set to meet the condition: 0°<θ<90°. In this embodiment, θ≈45°. As a result, the amount of light received by the light-receiving device 14 increases by $\sqrt{2}$ times at maximum.

It should be noted that the invention is not limited to the foregoing embodiments and may be varied variously. For example, the sectional configuration of the light-transmissive resin projection is not necessarily a triangle or analogous thereto and may be varied variously. Further, it is possible that the light-transmissive resin projection has one end superposed on the light-receiving device 14 and the other end superposed on the light-emitting device 13.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An optical coupling semiconductor apparatus comprising:
   a light-emitting device;
   a light-receiving device;
   lead frames carrying the light-emitting device and the light-receiving device, respectively, at locations spaced apart from each other; and
   a light-transmissive resin projection having a longitudinally extending tapered vertex portion, the tapered vertex portion extending at a nearly constant height between the light-emitting device and the light-receiving device, the projection functioning as an optical path by reflecting light emitted from the light-emitting device to gather the light to the vertex portion, and guiding the light thus gathered to the light-receiving device.

2. The optical coupling semiconductor apparatus of claim 1, wherein the light-emitting device and the light-receiving device have a light-emitting face and a light-receiving face, respectively, which are located on substantially the same reference plane.

3. The optical coupling semiconductor apparatus of claim 1, wherein the light-transmissive resin projection has a sectional configuration with the vertex portion and two sides defining the vertex portion.

4. The optical coupling semiconductor apparatus of claim 1, wherein the light-transmissive resin projection is formed of an epoxy resin which is capable of setting through cationic polymerization.

5. The optical coupling semiconductor apparatus of claim 1, wherein the light-transmissive resin projection having a dome-shaped portion at a location in a vicinity of the light-receiving device to converge light at the light-receiving device.

6. The optical coupling semiconductor apparatus of claim 1, wherein a distance l between the light-emitting device and the light-receiving device and a height L of the light-transmissive resin projection are set to satisfy the following relation:

$$l \geq L.$$

7. The optical coupling semiconductor apparatus of claim 1, wherein the light-transmissive resin projection has a width larger than a width of a light-emitting area of the light-emitting device and a width of a light-receiving area of the light-receiving device.

8. The optical coupling semiconductor apparatus of claim 1, wherein the light-transmissive resin projection has opposite ends located as superposed on the light-emitting device and the light-receiving device, respectively.

9. The optical coupling semiconductor apparatus of claim 1, wherein the light-transmissive resin projection has one end adjoining the light-receiving device.

10. The optical coupling semiconductor apparatus of claim 1, wherein the light-emitting device is shaped into a prism having at least two side walls oriented toward the light-receiving device.

* * * * *